United States Patent [19]

Veenendaal

[11] Patent Number: 4,751,457
[45] Date of Patent: Jun. 14, 1988

[54] INTEGRATED CIRCUIT PROBE PARALLELISM ESTABLISHING METHOD AND APPARATUS

[75] Inventor: Cornelis T. Veenendaal, Cornelius, Oreg.

[73] Assignee: Tektronix, Inc., Beaverton, Oreg.

[21] Appl. No.: 905,376

[22] Filed: Sep. 8, 1986

[51] Int. Cl.$^4$ ............... G01R 31/02; G01B 3/38
[52] U.S. Cl. ............... 324/158 F; 324/73 PC; 33/533
[58] Field of Search ........... 324/73 PC, 158 P, 158 F; 33/533, 504, 557, 645

[56] References Cited

U.S. PATENT DOCUMENTS 3,996,517 12/1976 Fergason et al. ............ 324/158 F X
4,660,294 4/1987 Schmidt ............... 33/533 X

OTHER PUBLICATIONS

Kenjo; "Stepping Motors and their Microprocessor Controls"; Clarendon Press. Oxford 1984; pp. 120–165.

Primary Examiner—Reinhard J. Eisenzopf
Assistant Examiner—Vinh P. Nguyen
Attorney, Agent, or Firm—William S. Lovell; David P. Petersen

[57] ABSTRACT

A probe mount carries a probe with test points having ends in a test point plane. The probe mount is supported at three spaced apart locations by respective first, second and third supports, each adjacent to a respective one of the test points. These probe supports permit independent shifting of each of the three locations along respective parallel lines. As these locations are shifted relative to one another, the test point plane is tilted until it is parallel to a second plane containing the surface of an integrated circuit wafer to be probed. A test surface is positioned in the second plane and advanced toward the probe. As the test points contact the test surface, the test point plane is tilted. Microprocessor controlled stepper motors may be used to tilt the test point plane and to shift the test surface.

16 Claims, 1 Drawing Sheet

INTEGRATED CIRCUIT PROBE PARALLELISM ESTABLISHING METHOD AND APPARATUS

TECHNICAL FIELD

The present invention relates to a method and apparatus for adjusting the plane containing test points of a probe and the plane of a surface of an integrated circuit wafer to be probed so as to be parallel to one another.

BACKGROUND OF THE INVENTION

An integrated circuit testing probe typically has a multiplicity of test points with ends or tips in a test point plane. Probes having from sixteen to four hundred of these test points are common. During testing of an integrated circuit wafer or chip, these test points are moved into contact with test locations in the plane of a surface of the integrated circuit wafer. Difficulties are encountered in making contact between each of these test points and the test locations on the wafer surface unless the test point plane and the wafer surface are parallel to one another.

Therefore, a need exists for a method and apparatus for effectively establishing parallelism between a test point plane of a probe and the surface of an integrated circuit wafer which is to be probed.

SUMMARY OF THE INVENTION

A probe mount carries an integrated circuit probe having at least three test points with ends in a test point plane. The probe mount is supported at three spaced apart locations by respective first, second and third support means, each adjacent to a respective one of the test points. These probe support means are connected to the probe mount so as to permit independent shifting of each of the three locations along respective generally parallel lines. As these locations are shifted relative to one another, the test point plane is tilted until it is parallel with a second plane comprising the plane of the wafer surface of an integrated circuit wafer to be probed. Microprocessor controlled stepper motors may be used to tilt the test point plane as required.

As another aspect of the present invention, a planar test surface is movable toward and away from the test point plane. The test surface is typically positioned in a plane parallel to or coincident with the second plane. Contact between the three test points and this test surface is detected and the test point plane is tilted until each of the three test points is in contact with the test surface. When this occurs, parallelism exists between the test point plane and the second plane.

As a further more specific aspect of the present invention, a first drive mechanism is provided for shifting the first location in either direction along the first line. A second drive mechanism is also provided for shifting the second location in either direction along a second line parallel to the first line. In addition, a third drive mechanism is provided for shifting the third location in either direction along a third line parallel to the first and second lines. Moreover, a fourth drive mechanism is provided for shifting the test surface toward and away from the test point plane along a fourth line which is generally parallel to the first, second and third lines. The test surface is advanced by the fourth drive mechanism until contact between one of the test points and the test surface is detected. The drive mechanism associated with the contacting test point then shifts the location of the probe mount to which this drive mechanism is connected in unison with continued advancement of the test surface toward the remaining two non-contacting test points. Contact with a next of the three test points is then detected. When this happens, the drive mechanism associated with this next contacted test point is then operated so that the locations associated with the two contacted test points are moved in unison with continued advancement of the test surface. Eventually, the last of the three test points contacts the test surface and parallelism is established between the first and second planes.

As still another aspect of the present invention, each of the drive mechanisms may comprise a microprocessor controlled stepper motor. In addition, the microprocessor may store the positions of the respective drive motors at which contact of all three of the test points is established. This information is then used to control the respective drive motors to automatically reestablish parallelism between the test point plane and the second plane as desired.

It is accordingly one object of the present invention to provide an improved method and apparatus for establishing parallelism between a test point plane containing the ends of test points of an integrated circuit probe and the plane containing the surface of an integrated circuit wafer to be probed.

It is another object of the present invention to provide such a method and apparatus for manually or automatically establishing such parallelism.

It is a further object of the present invention to provide a relatively simple, efficient, rapid and cost effective method and apparatus for establishing such parallelism.

These and other objects, features and advantages of the present invention will become apparent with reference to the following description and drawings.

DETAILED DESCRIPTION OF A PREFERRED EMBODIMENT

Figure 1:
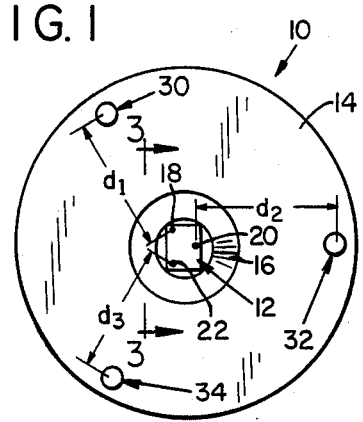
FIG. 1 is a front elevational view of a probe mount and integrated circuit probe employed in the apparatus of the present invention.
Figure 3:
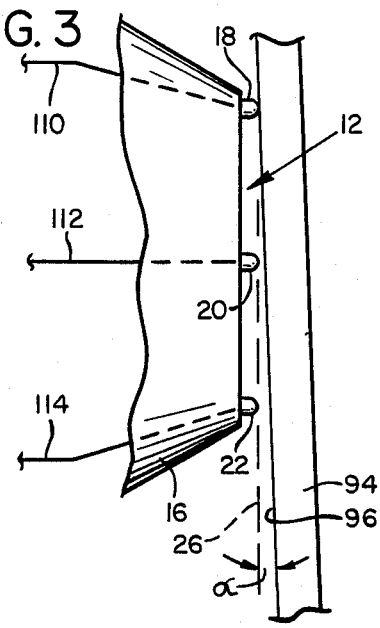
FIG. 3 is an enlarged view of a portion of a probe, probe mount and test surface taken along line 3—3 of FIG. 1.

One form of probe mount 10 for carrying an integrated circuit probe 12 is shown in FIG. 1. This mount includes an annular plate or ring 14 with a frustoconical central projection 16 extending outwardly from one surface of the ring 14. The probe 12 is mounted to the distal end of projection 16 and includes a multiplicity of test points for making electrical connection with test locations of an integrated circuit wafer to be probed. Three of these test points 18, 20 and 22 are shown in FIGS. 1 and 3. Conventional probes typically include from sixteen to four hundred or more of these test points. These test points comprise minute pins or bumps with tips that are generally positioned in a test point plane 26, as illustrated in FIG. 3.

The probe mount 10, and more specifically ring 14, is supported at three spaced apart locations 30, 32 and 34 as described below. Moreover, ring 14 is supported such that locations 30, 32 and 34 are movable in directions normal to ring 14 and relative to one another to thereby tilt the plane of ring 14 and correspondingly the test point plane 26. In the illustrated embodiment, locations 30, 32 and 34 are spaced one hundred and twenty degrees apart about the circumference of ring 14 and thus about the center of the probe 12. In addition, location 30 is spaced a distance $d_1$ from an adjacent test point 18, location 32 is positioned a distance $d_2$ from an adjacent test point 20 and location 34 is spaced a distance $d_3$ from an adjacent test point 22. In addition, the distances $d_1$, $d_2$ and $d_3$ are typically equal to one another. Again, with this construction, shifting of the locations 30, 32 and 34 relative to one another causes the test point plane to tilt.

Figure 2:
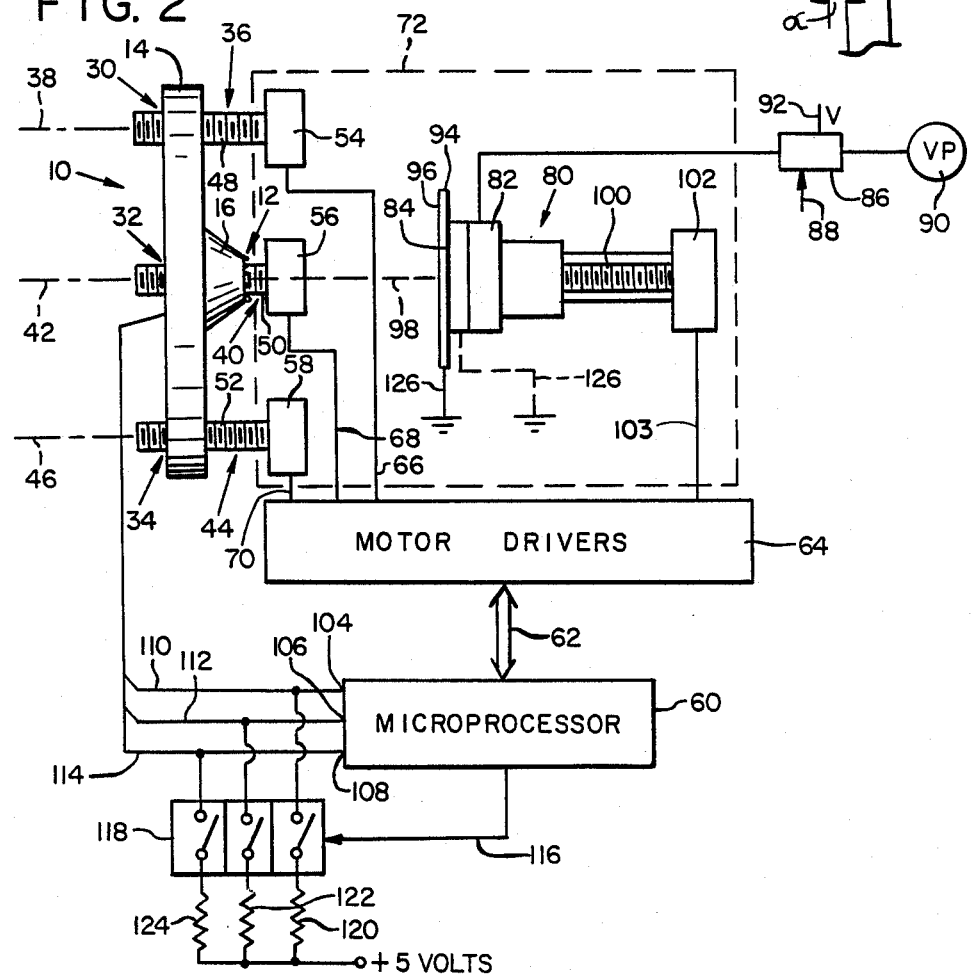
FIG. 2 is a side elevational view, partially in schematic form, of a parallelism establishing apparatus in accordance with the present invention.

A mount support is provided for supporting plate 14 at the three locations 30, 32 and 34. As shown in FIG. 2, the illustrated form of mount support includes a first support mechanism 36 connected to plate 14 at location 30. The first support mechanism is capable of shifting location 30 in either direction along a dashed line indicated at 38. A second similar mechanism 40 supports the plate 14 at location 32 such that this later location is movable in either direction along a dashed line 42. Moreover, a third such mounting mechanism 44 is connected to plate 14 at location 34 for shifting this location in either direction along a line 46. The lines 38, 42 and 46 are generally parallel to one another as shown.

More specifically, the illustrated form of mechanism 36 includes a rotatable jack screw 48 which is threadedly coupled to the plate 14 such that rotation of the jack screw in either direction shifts location 30 along the line 38. Support mechanisms 40 and 44 also include similar jack screws 50 and 52. Each of these jack screws 48, 50 and 52 may be threaded through a respective bushing (not shown) which is pivoted to the plate 14. Consequently, when one or more of the jack screws are rotated relative to the other jack screws, the plate 14 and probe 12 tilts and thereby adjusts the test point plane 26.

Although jack screws 48, 50 and 52 may be manually rotated to shift the plate 14 along the lines 38, 42 and 46, drive mechanisms are typically provided for this purpose. These drive mechanisms may comprise respective stepper motors 54, 56 and 58 for rotating jack screws 48, 50 and 52. Such jack screw motor assemblies are commercially available from a number of sources, such as Airpax Company of Cheshire, Conn. A microprocessor 60 controls the operation of these stepper motors. The microprocessor 60 is coupled by a bus 62 to conventional motor driver cards 64 and in turn by conductors 66, 68 and 70 to the motors 54, 56 and 58. In response to drive pulses from microprocessor 60, the motors are stepped to rotate the jack screws in the desired direction. These motors are rigidly mounted to a housing or base indicated schematically at 72 so that the plate 14, and not the motors, moves as the jack screws rotate.

The apparatus includes an integrated wafer support mechanism 80 for supporting integrated circuit wafers which are to be probed. One such mechanism comprises a commercially available vacuum chuck 82 with a planar wafer support surface 84 against which one surface of an integrated circuit wafer is mounted. The exposed surface of the mounted wafer is then positioned in a plane parallel to surface 84 for probing by the probe 12. With the wafer positioned on surface 84, a valve 86 is shifted, either manually or in response to control signals from microprocessor 60 at a control input 88, to couple a vacuum pump 90 to the chuck 82. This draws a vacuum at surface 84 and holds the wafer in place. To remove the wafer, valve 86 is shifted to vent the vacuum through a vent 92.

As explained below, surface 84 may comprise a test surface used in establishing parallelism between the test point plane 26 and the exposed surface of the integrated circuit wafer to be probed. Alternately, a test wafer 94 of the same thickness as the integrated circuit wafer to be tested is positioned on surface 84. In this case, the exposed surface 96 of this test wafer comprises a test surface and is in the plane of the surface of the integrated circuit wafer to be probed.

A drive mechanism is provided for shifting the chuck surface 84, and thus the test surface 96, toward and away from the probe 12 along a line 98. Line 98 is generally normal to the surfaces 84, 96 and intersects the probe 12. This chuck drive mechanism includes a jack screw 100 which is rotated by a stepper motor 102 under the control of microprocessor 60, by connection through bus 62 to motor drivers 64 and thence through conductor 103 to stepper motor 102. Alternately, jack screw 100 may be manually rotated. In addition, chuck 82 may be equivalently fixed in place with the probe 12 being advanced and retracted along line 98 by the motors 54, 56 and 58 during parallelism adjustment and circuit probing operations. However, speed and accuracy of integrated circuit wafer testing is enhanced when chuck 82 is driven by a separate drive mechanism.

In general, as can be seen in FIG. 3, a small angle alpha typically exists between test point plane 26 and test surface 96 prior to any parallelism adjustment. The following approach is used to reduce this angle alpha and establish parallelism between these two planes.

First, the distance between test surface 96 and probe 12 is reduced as by controlling motor 102 to advance the test surface 96 along line 98 toward the probe. Eventually, as shown in FIG. 3, one of the three selected test points 18, 20 and 22 (in this case test point 18) contacts the test surface 96. When this takes place, the drive mechanism 36 associated with this contacting test point 18, namely, motor 54 and jack screw 48, is operated under the control of microprocessor 60 to advance the location 30 along line 38. Location 30 is shifted at the same rate and in unison with continued advancement of test surface 96 along line 98 toward the other two non-contacting test points 20, 22. Shifting of location 30 commences the tilting of test point plane 26 toward the plane of the test surface 96. Eventually, another of the two non-contacting test points, for example, test point 20, contacts the test surface 96. Its associated drive mechanism 40 is then operated in a similar manner to drive mechanism 36. That is, motor 56 rotates jack screw 50 under the control of microprocessor 60 to shift location 32 along line 42 in unison with further advancement of the test surface 96. At the same time, motor 54 continues the motion of location 30. Finally, the last of the three test points, namely test point 22 in this example, contacts the test surface 96. When this happens, the motors stop as parallelism is established between the plane of test surface 96 and test point plane 26. This in turn establishes parallelism between the test point plane and the plane of the integrated circuit wafer to be tested.

Of course, if two of the test points 18, 20 and 22 happen to contact the test surface 96 simultaneously, their associated drive motors are activated to shift their associated locations on plate 14 and the contacting test points in unison with further movement of the chuck. Again, when the third test point makes contact with the test surface, parallelism is established.

At the moment all of the test points are in contact with the test surface 96, a reference plane is established. Microprocessor 60 may store the position of this reference plane by storing the position to which the respective locations 30, 32 and 34 were shifted by motors 54, 56 and 58 during the establishment of parallelism. This enables rapid reestablishment of parallelism during future integrated circuit probing by simply adjusting jack screws 48, 50 and 52 to the same relative positions.

In addition, chuck 82 may be backed away from probe 12 a predetermined distance after parallelism has been established. Thereafter, the test wafer 94 may be replaced with the integrated circuit wafer to be probed. Following this, the chuck is moved the predetermined distance back toward the probe 12 to establish contact between the test points and the integrated circuit wafer. Assume the case in which surface 84 is used as the test surface instead of a test wafer 94. In this case, after the integrated circuit wafer 16 is mounted on the chuck, the chuck is advanced toward the probe a distance which is equal to the distance it was backed off from the probe contacts 18, 20 and 22, less the thickness of the wafer. In this manner, by merely adjusting the advancement and retraction of chuck 82 along line 98, integrated circuit wafers of varying thicknesses may be probed. In addition, probe 12 is maintained in parallelism with the surfaces of these wafers which are being tested. Moreover, microprocessor 60 may control motor 102 to shift the chuck to various positions, for example, to a position for loading and unloading integrated circuit wafers or chips. Thereafter, the microprocessor can control motor 102 to shift the wafers back in contact with the test points.

Those skilled in the art will recognize that a number of ways exist for detecting the initial contact between a particular test point and the test surface 96 (or surface 84 in the event the chuck itself is used to establish the test surface). One such contact detection approach for electronically detecting contact between the test points and test surface will next be described. Typically, microprocessor 60 has plural inputs and outputs connected by conductors to the various test points of probe 12. Three such inputs 104, 106 and 108 are labeled in FIG. 2 and are connected by respective electrical conductors 110, 112 and 114 to the test points 18, 20 and 22 (See FIG. 3). Whenever it is desired to establish parallelism between the test point plane and reference plane, microprocessor 60 sends a parallelism control signal on a line 116 to a switch 118. This causes the switch contacts to close. When closed, a positive voltage supply is connected through a current limiting resistor 120 to the input 104. This voltage is at the high or logic one level for microprocessor 60. Similarly, this supply voltage is coupled through respective resistors 122 and 124 to the lines 112 and 114. This places the contacts 18, 20 and 22 at a high or logic one level. In addition, test wafer 94 may comprise an electrically conductive wafer, such as a gold plated wafer, connected to electrical ground potential as at 126. Alternately, in the event a test wafer 94 is not used, the surface 84 is electrically conductive and is electrically grounded as indicated in dashed lines at 126.

When connected in this manner, input 104 drops to a zero logic level whenever test point 18 contacts the grounded test surface 96 or 84. Similarly, microprocessor input 106 drops to a zero logic level when test point 20 contacts the test surface 96. Furthermore, microprocessor input 108 also drops to a logic zero level when test point 22 contacts the test surface. Thus, microprocessor 60, by way of this touch contact detection circuitry, determines when the initial contact is made between the respective test points and the test surface. When contact is detected, the motors 54, 56 and 58, as well as motor 102, are automatically controlled as explained above to establish parallelism between the test point plane 26 and the test surface 96. This in turn establishes parallelism between plane 26 and the plane of the integrated circuit wafer to be probed.

Having illustrated and described the principles of my invention with reference to one preferred embodiment, it should be apparent to those persons skilled in the art that such invention may be modified in arrangement and detail without departing from such principles.

I claim as my invention all such modifications as come within the true spirit and scope of the following claims:

1. An apparatus used in testing an integrated circuit wafer having a surface, for establishing parallelism between a first plane within an integrated circuit probe having at least a first, a second and a third test point separately disposed therein, said test points each having a distal end thereof and said first plane being defined by the physical location of said distal ends of said test points, and a second plane containing the surface of an integrated circuit wafer to be probed, comprising:
   probe mounting means for supporting the probe;
   a test surface positioned in a plane parallel to or coincident with the second plane for contact by the first, second and third test points;
   detecting means for detecting contact of the first, second and third test points with the test surface;
   positioning means for moving the probe mounting means to position the first, second and third test points against the test surface, such positioning means being responsive to the detecting means for tilting the first plane to position all of the first, second and third test points against the test surface and thereby establish parallelism between the first and second planes.

2. An apparatus according to claim 1 in which said positioning means also comprises means for positioning the test surface in contact with the first, second and third test points.

3. An apparatus used in testing an integrated circuit wafer having a surface, for establishing parallelism between a first plane within an integrated circuit probe having at least a first, a second and a third test point separately disposed therein about a center of said probe, said test points each also having a distal end thereof and said first plane being defined by the physical location of said distal ends, and a second plane coincident with or parallel to a test surface, comprising:
   wafer support means for supporting the integrated circuit wafer to be tested, the surface of said wafer having at least three contact points therein and defining said test surface;
   means for bringing said test surface into coincidence with said second plane;
   a probe mount for carrying the probe;
   mount support means for supporting the probe mount with the test points facing the test surface and with the first plane generally parallel to the test surface, said mount support means including;

first support means connected to the probe mount at a first location adjacent to an associated first test point, the first support means supporting the probe mount for movement of the first location in either direction along a first line so as to move the first test point toward and away from the test surface, second support means connected to the probe mount at a second location adjacent to an associated second test point, the second location being spaced from the first location, the second support means supporting the probe mount for movement of the second location in either direction along a second line which is generally parallel to the first line so as to move the second test point toward and away from the test surface, third support means connected to the probe mount at a third location adjacent to an associated third test point, the third location being spaced from the first and second locations, the third support means supporting the probe mount for movement of the third location in either direction along a third line generally parallel to the first and second lines so as to move the third test point toward and away from the test surface;

the first, second and third locations of the probe mount being independently moveable along the first, second and third lines so as to tilt the first plane into parallelism with the test surface and thereby with the second plane; and detection means for detecting contact between each of the first, second and third test points and the contact points within the test surface, whereby parallelism is achieved when all of the first, second and third test points are in contact with the test surface.

4. An apparatus according to claim 3 in which the means for bringing said test surface into coincidence with said second plane comprises a test plate mounted to the wafer support means and having an exposed planar surface which comprises the test surface.

5. An apparatus according to claim 3 in which the wafer support means includes a planar wafer support surface to which the integrated circuit wafer to be probed is mounted, the test surface comprising the planar wafer support surface.

6. An apparatus according to claim 3 in which the first, second and third locations are spaced one-hundred and twenty degrees apart about the center of a probe mounted to the probe mount.

7. An apparatus according to claim 3 in which the distances between the first, second and third locations and the respective first, second and third test points are approximately equal.

8. An apparatus according to claim 3 in which the wafer support means comprises means for supporting the wafer for movement in either direction along a fourth line generally parallel to the first, second and third lines and normal to the second plane, whereby movement along the fourth line shifts the second plane and also the test surface toward and away from the probe, the apparatus also including:

wafer support drive means responsive to drive control signals for shifting the second plane and test surface along the fourth line;

first drive means responsive to drive control signals for moving the first location along the first line;

second drive means responsive to drive control signals for moving the second location along the second line;

third drive means responsive to drive control signals for moving the third location along the third line;

the detection means comprising means for generating first, second and third detection indicating signals corresponding to contact between the respective first, second and third test points and the test surface;

control means for generating drive control signals for each of said wafer support drive means, the first drive means, the second drive means and the third drive means, the control means also being coupled to the detection means for receiving the detection indicating signals, the control means comprising means for controlling each of the drive means to advance the test surface in a first direction along the fourth line toward the probe until one of the first, second and third test points contacts the test surface, to thereupon move the location of the probe mount associated with the test point that first contacts the test surface in the first direction in unison with continued advancement of the test surface in the first direction until another of the remaining two non-contacting test points contacts the test surface, to thereupon move the locations of the probe mount associated with the test points that later contact the test surface in the first direction in unison with continued advancement of the test surface in the first direction until the last of the non-contacting test points contacts the test surface, at which time parallelism is established between the first and second planes.

9. An apparatus according to claim 8 in which the control means comprises means for storing the positions of the first, second and third drive means and associated first, second and third locations at which the first, second and third test points all contact the test surface and for controlling the driving of such first, second and third drive means to the stored positions to establish parallelism between the first and second planes.

10. An apparatus according to claim 9 in which each of said drive means comprises a stepper motor and jack screw assembly.

11. An apparatus according to claim 9 in which the control means comprises a microprocessor with first, second and third inputs, the detection means comprising means for varying the logic level of signals applied to the first, second and third inputs to indicate contact between the respective first, second and third test points and the test surface.

12. An apparatus according to claim 11 in which the detection means comprises means for selectively coupling a high logic level voltage to the first, second and third inputs, means for electrically connecting the first, second and third inputs to the respective first, second and third test points, and means for electrically gounding the test surface, whereby each of the first, second and third inputs to the microprocessor drop to a low logic level upon contact of the test point connected to said each input and the test surface.

13. A method for establishing parallelism between a first plane containing the ends of test points, including first, second and third spaced apart test points, of an integrated circuit probe and a second plane, the first plane initially being generally parallel to and spaced a first distance in a first direction from the second plane, comprising:
- decreasing the first distance in the first direction between the first and second planes;
- detecting intersection of the end of one of the first, second and third test points and the second plane and thereby defining a second distance;
- decreasing the second distance between the second plane and the remaining two of the first, second and third test points other than said one of the test points;
- detecting intersection of the end of one of the remaining two of the first, second and third test points and the second plane and thereby defining a third distance;
- decreasing the third distance between the second plane and the last of the first, second and third test points other than said one of the test points and said one of the remaining two test points; and
- detecting intersection of the last of the first, second and third test points and the second plane, parallelism between the first and second planes being established upon the intersection of all of the first, second and third test points and the second plane.

14. A method according to claim 13 including the step of positioning a test surface in or parallel to the second plane and initially spaced in the first direction from the first plane, the step of decreasing the distance comprises the step of advancing the test surface in the first direction toward the first plane, and in which the remaining steps comprises detecting intersection of the end of one of the first, second and third test points and the second plane, advancing the test surface toward the first plane while simultaneously moving said one of the test points in contact with the test surface at the same rate and in the same direction as the test surface, detecting intersection of the end of one of the remaining two of the first, second and third test points other than said one test point, advancing the test surface toward the first plane while simultaneously moving said one and said one of the remaining two test points in contact with the test surface at the same rate and in the same direction as the test surface, and detecting intersection of the last of the first, second and third test points and the test surface, parallelism between the first and second planes being established upon the contact of all of the first, second and third test points and the test surface.

15. A method according to claim 14 in which the sequence of steps are automatically performed after an initial commencement of the sequence.

16. A method according to claim 14 including the step of storing the position of the first plane at which initial contact is made by all of the first, second and third test points.

* * * * *